United States Patent [19]
Mapleston

[11] Patent Number: 5,661,754
[45] Date of Patent: Aug. 26, 1997

[54] RECEIVER ARRANGEMENT

[75] Inventor: David Bernard Mapleston, Swindon, United Kingdom

[73] Assignee: Plessey Semiconductors Limted, United Kingdom

[21] Appl. No.: 411,539

[22] Filed: Mar. 28, 1995

[30]     Foreign Application Priority Data

Apr. 29, 1994  [GB]  United Kingdom ............. 9408576

[51] Int. Cl.$^6$ ................................................ H03K 7/04
[52] U.S. Cl. ................. 375/239; 375/256; 375/310;
375/328; 340/855.4; 340/870.19; 340/825.59;
340/825.69; 329/313; 327/90; 327/101
[58] Field of Search ......................... 375/239, 256,
375/259, 285, 286, 289, 309, 310, 317,
318, 328, 338, 342, 351; 455/92, 352; 340/855.4,
870.19, 870.24, 825.57, 825.69; 329/311,
313; 327/28–30, 101, 18, 90

[56]           References Cited

U.S. PATENT DOCUMENTS

| 3,729,633 | 4/1973 | Eros et al. ................... 359/189 |
| 3,916,326 | 10/1975 | Woyton ........................ 327/30 |
| 4,153,848 | 5/1979 | Miyazaki ...................... 327/28 |
| 4,206,316 | 6/1980 | Burnsweig et al. ........... 375/239 |
| 4,943,736 | 7/1990 | Kihara et al. ................. 327/100 |
| 5,539,779 | 7/1996 | Nagahori ...................... 375/317 |

FOREIGN PATENT DOCUMENTS

| 0 451 748 A2 | 10/1991 | European Pat. Off. . |
| 0 564 349 A1 | 10/1993 | European Pat. Off. . |
| 0 579 236 A1 | 1/1994 | European Pat. Off. . |
| 386743 | 1/1933 | United Kingdom . |
| 1 104 212 | 2/1968 | United Kingdom . |
| 1 223 596 | 2/1971 | United Kingdom . |
| 1 379 061 | 1/1975 | United Kingdom . |

Primary Examiner—Stephen Chin
Assistant Examiner—Amanda T. Le
Attorney, Agent, or Firm—Kirschstein et al.

[57]              ABSTRACT

An infrared remote-control receiver employs at its front end a gyrator-configured transistor operating as a current-to-voltage converter, but derives its data information from a negative-going gyrator output pulse in preference to the more conventionally used positive-going pulse. This negative-going pulse may be wider than the positive-going pulse and reduces the bandwidth demand on subsequent processing circuitry. This enables low-bandwidth, low-current hardware to be used which makes the receiver ideal for use in battery-operated systems. Also, the negative-going pulse is easier to detect, as it directly follows a disturbance known to be in the opposite direction. The result is an increased receiver sensitivity.

10 Claims, 3 Drawing Sheets

RECEIVER ARRANGEMENT

BACKGROUND OF THE INVENTION

The invention concerns a receiver arrangement for use in a remote-control system, and in particular, but not exclusively, a receiver arrangement for use in an infrared pulse position modulation (PPM) remote-control system.

Infrared remote-control systems are known in which an infrared diode is used in conjunction with appropriate circuitry in a receiver to pick up and demodulate data pulses transmitted from an infrared transmitting diode situated at a point remote from the receiver.

One known form of a receiver front-end stage is shown in FIG. 1. As seen from FIG. 1, the stage centers around a bipolar transistor 12 arranged to receive the current output from an infrared diode 19. A resistor 13 is connected between the base and collector of the transistor 12, a capacitor 14 is connected between the base and a first reference potential 15, and a resistor 16 is connected between the same reference potential and the emitter of the transistor 12. A current source 17 is connected between a second reference potential 18 and the collector of the transistor 12, and the infrared diode 19 is connected in parallel with the current source 17. A diode 20 may also be interposed between the current source 17 and the collector of the transistor 12, for reasons which will be explained below.

The operation of the receiver stage, which functions as a form of current-to-voltage converter, will now be explained.

Under conditions in which diode 19 is not exposed to infrared radiation, a current $i=I_D$ flows into a node 21 of the receiver stage, where $I_D$ is a quiescent current generated by the current source 17. This current is known as the "dark current" and sets up the required biasing conditions in the stage, when no transducer input signal is present, to turn the transistor slightly on.

Current $I_D$ flows through the resistor 13 as base current and charging current for the capacitor 14, and also through the collector of transistor 12 as collector current resulting from this base current. Under quiescent conditions, capacitor 14 is charged to a potential which allows an emitter current to flow through resistor 16 equal to $I_D$, the ratio of collector current to base current being determined by the current gain of the transistor 12. The quiescent value of the collector voltage relative to the reference potential 15 is given by the expression:

$$V_C = I_D \left\{ R_{16} + \frac{R_{13}}{1 + h_{FE}} \right\} + V_{BE}$$

where $V_C$=collector voltage $I_D$=dark current $R_{16}$=resistance of resistor 16

$R_{13}$=resistance of resistor 13

$h_{FE}$=current gain of transistor 12

$V_{BE}$=base-emitter voltage of transistor 12.

With the component values shown in FIG. 1, and assuming $I_D$, $h_{FE}$ and $V_{BE}$ to be 1 µA, 40 and 550 mV, respectively, this yields a collector voltage slightly in excess of 0.55 V. In practice, diode 19 will usually be subject to ambient light, which will generate a DC current adding to the dark current $I_D$. This, in turn, will increase the collector voltage $V_C$ above its dark-current value; however, provided the current gain $h_{FE}$ of the transistor 12 is high and the value of the emitter resistor 16 is low, collector voltage is dominated by the $V_{BE}$ of the transistor 12 and the circuit will be relatively insensitive to changes in ambient-light level.

Since the collector voltage under quiescent conditions is so low, a diode 20 may be added as shown to lift the output voltage of the circuit to a level which can more easily be dealt with by subsequent circuitry.

When now a transmitted pulse of light is detected by the diode 19, a pulse of current is produced in the diode 19. This flows in the first instance through resistor 13, not through the collector of the transistor 12 since the potential on the base of the transistor has not yet had the chance to rise due to the fact that the voltage on the capacitor 14 cannot instantaneously change. This creates a pulse of voltage across resistor 13 and a corresponding positive-going voltage pulse on the collector approximately equal to $I_P \times R_{13}$. This collector pulse has substantially the same pulse width as the transmitted pulse. It is this pulse which is detected and decoded in conventional remote-control systems.

A disadvantage of known receiver arrangements using the above circuit is that, since the positive-going pulse appearing on the collector is fast and can also be of large amplitude, any subsequent circuitry used to detect and decode the received pulse has to exhibit a high bandwidth to cope with this. High-bandwidth amplifying and other devices require high supply currents to operate effectively, and where such an arrangement is incorporated in a portable, battery-operated unit, which is often the case, the drain on the battery can be considerable.

It would be desirable to provide an arrangement which seeks to overcome or mitigate the above disadvantages.

SUMMARY OF THE INVENTION

In accordance with a first aspect of the invention, there is provided a receiver arrangement for use in a remote-control system, comprising a receiver stage, for receiving a current pulse from a transducer and outputting a voltage output signal in response to the current pulse, and a pulse detector stage, for receiving the voltage output signal of the receiver stage and providing a data output signal in dependence thereon, the receiver stage comprising pulse-generation means for generating as the voltage output signal a signal which includes a first pulse substantially coincident with the received current pulse and a second, immediately following, opposite-going pulse at the end of the received current pulse, the pulse detector stage comprising data signal providing means for providing the data output signal in response to the second pulse.

The pulse-generation means may be arranged such that it can provide, in response to the current pulse, a second pulse which has a pulse width greater than that of the first pulse.

By basing the detection of a received current pulse not on a conventionally used fast pulse from the receiver stage, which coincides with the received current pulse output from the transducer, but on a slower, and preferably wider, pulse following the fast pulse, correspondingly slower, cheaper and lower-current processing devices may be employed in the subsequent pulse detector stage. In addition, the second pulse is easier to detect, as it directly follows a disturbance known to be in the opposite direction. The result is an increased receiver sensitivity.

The pulse-generation means may be arranged to limit the amplitude of the second pulse. Such limiting prevents overloading of the receiver stage during high input signal conditions.

The pulse-generation means may comprise an amplifying element having first and second output terminals and an input terminal, the first and second output terminals being connected respectively to a transducer input node and to a first reference potential, the input terminal being connected to the first output terminal through a first resistance and to the first reference potential through a first capacitance, the output of the receiver stage being taken from the transducer input node.

The second output terminal may be connected to the first reference potential through a second resistance, which has the advantage of helping to stabilize the operating conditions of the amplifying element.

A voltage-shifter may be advantageously interposed between the first output terminal of the amplifying element and the transducer input node. This lifts the quiescent output voltage level of the receiver stage and facilitates the subsequent pulse detection process.

A transducer may be connected between the transducer input node and a second reference potential.

The amplifying element is preferably a bipolar transistor.

The data signal providing means may include a pulse discriminator stage for forming a first output signal representative of the average level of the output signal of the receiver stage and a second output signal representative of the instantaneous level of the output signal of the receiver stage, and a comparator stage for comparing the first and second output signals of the pulse detector stage and providing, on the basis of that comparison, the data output signal.

The pulse discriminator stage may include first and second voltage-followers for providing the first and second output signals of the pulse discriminator stage, the first and second voltage-followers having respective inputs for receiving a common signal representative of the output signal of the receiver stage, and the first voltage-follower having an output which provides the first output signal of the pulse discriminator stage through a low-pass filter. The filter preferably includes a third resistance and a second capacitance connected in series between the output of the first voltage follower and a reference potential.

By arranging for the output of one of the voltage followed to be low-pass filtered, two different signals may be derived from the pulse discriminator stage, the difference of which signals represents the pulse component of the receiver stage output signal. Any quiescent component of that output signal, representing largely the ambient light level experienced by the transducer, is common-mode as far as the voltage followers are concerned.

A fourth resistance may be connected in parallel with the second capacitance, the fourth resistance serving to adjust the sensitivity of the receiver arrangement.

A second voltage shifter may be interposed between the receiver stage and the first and second voltage followers of the pulse discriminator stage. The second voltage shifter may include a third voltage follower feeding the first and second voltage followers. At least one diode element may be interposed between the third voltage follower and the first and second voltage followers. The advantage of this is that it complements the voltage-shifting effect of the first voltage shifter associated with the receiver stage.

A current source may be included in the output circuit of each voltage follower, establishing an output current in each follower. The voltage followers are preferably emitter followers.

A buffer stage may be interposed between the receiver stage and the pulse detector stage. The buffer stage may be arranged to amplify the output signal of the receiver stage.

According to a second aspect of the invention, there is provided a remote-control apparatus comprising a receiver arrangement, as described above, and an infrared transducer connected thereto.

BRIEF DESCRIPTION OF THE DRAWINGS

The invention will now be described, by way of example only, with reference to the drawings, of which.

DETAILED DESCRIPTION OF THE INVENTION

Figure 1:
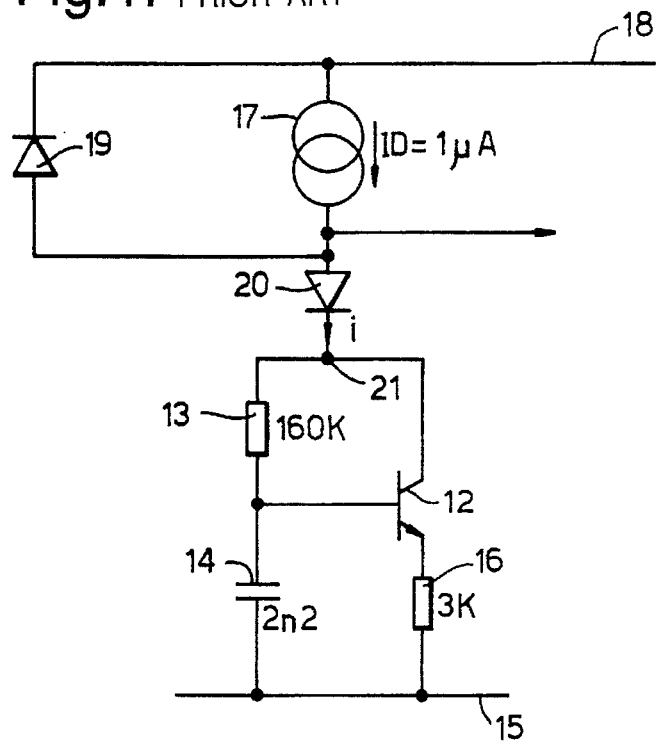
FIG. 1 is a circuit diagram of a known infrared receiver front-end stage according to the prior art.
Figure 2:
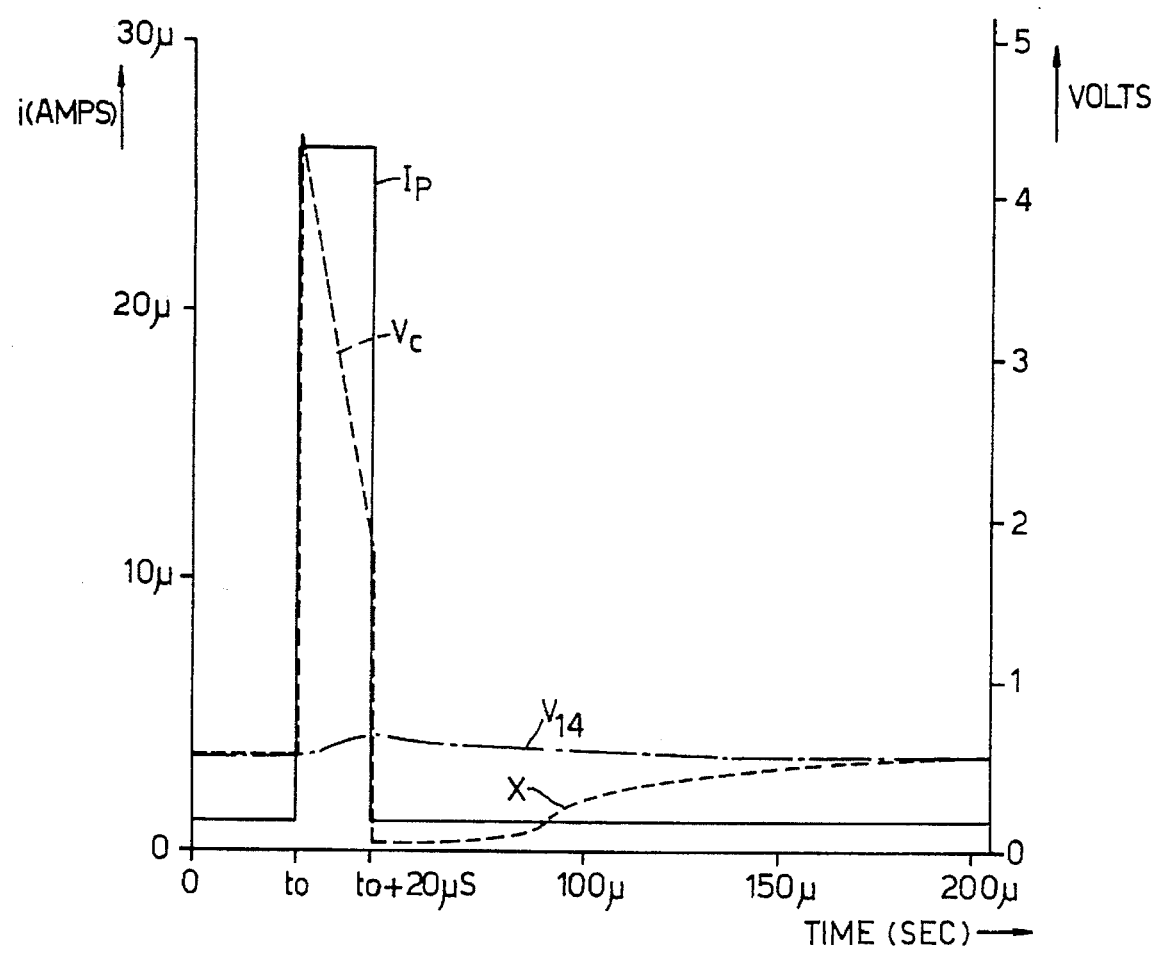
FIG. 2 is a graph illustrating the behaviour of the front-end stage shown in FIG. 1 when it is exposed to a high-amplitude transducer current pulse according to the prior art.

Referring now to FIG. 2, when a data pulse is transmitted to a receiver incorporating the circuit shown in FIG. 1, the diode 19 in the receiver generates a corresponding current pulse which is shown as current $I_P$ in FIG. 2. $I_P$ starts at time $t_0$ and lasts in this case for 20 µS. The current pulse, which in this case results from a very strong received signal, has an amplitude of 25 µA and at the end of the 20 µS period the current into the receiver stage returns to its quiescent level, the dark current, $I_D$, which is 1 µA. At $t=t_0$, the collector voltage $V_C$ rises instantaneously from its quiescent value of approximately 0.55 V to 0.55+(25 µA×160 K)≈4.5 V, upon which it decreases rapidly as the share of $I_P$ flowing through resistor 13 is progressively diverted into the collector of transistor 12 due to the increase of charge on capacitor 14.

At the end of the 25 µS current pulse, a discontinuity in the $V_C$ curve occurs as the current entering the receiver stage decreases suddenly from $I_D+I_P$, to $I_D$. At this point, the transistor stage looks like a common-emitter amplifier stage with emitter degeneration due to resistor 16, in which the input voltage of the stage is the voltage appearing across the capacitor 14 and the gain G of the stage is:

$$G = -\frac{R_{13}}{R_{16} + r_e}$$

where $$r_e = \frac{kT}{q \cdot I_C}$$

and kT/q=26 mV at room temperature, and $I_C=I_D+I_P=26$ µA. The collector load is the resistor 13 fed from the voltage on the capacitor 14 at the moment the input current pulse ends. The result is a flow of current from the capacitor 14 through resistor 13 to the collector of transistor 12, a negative-going voltage pulse being thereby produced on the collector. The magnitude of this pulse can be approximated by the equation:

$$V_P = \frac{0.7 \cdot I_P \cdot T}{C_{14}} \cdot \frac{R_{13}}{\frac{26 \text{ mV}}{I_D + I_P} + R_{16}}$$

Figure 3:
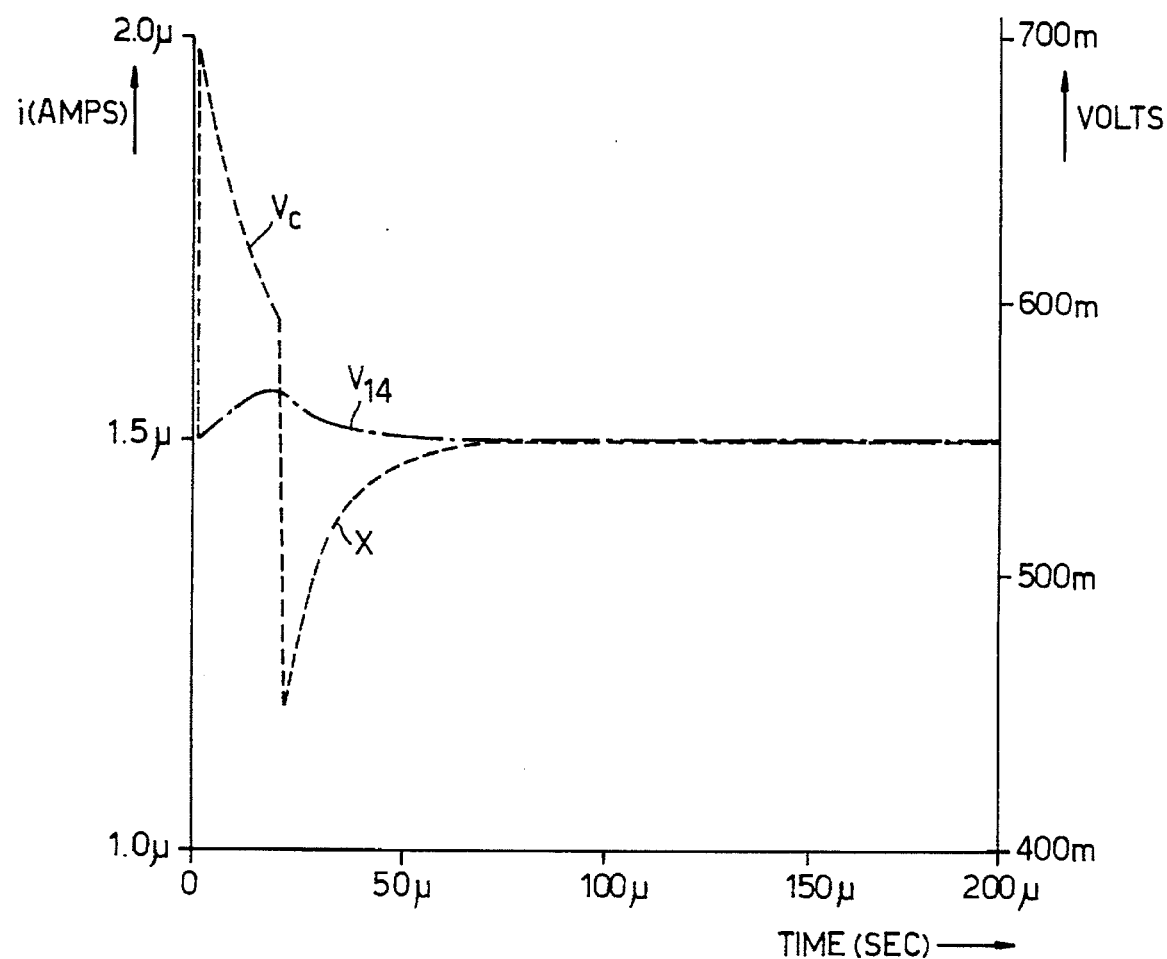
FIG. 3 is a graph similar to that of FIG. 2, but for a low-amplitude transducer current pulse according to the prior art.

The pulse decays as the capacitor 14 slowly discharges through resistor 13 (see the part of the $V_C$ curve marked "X" and the corresponding part of the curve of capacitor voltage ($V_{14}$) in FIG. 2). This causes some stretching of the pulse which can facilitate detection of the pulse in a subsequent pulse detection stage. At high levels of diode pulse current the transistor will saturate, giving a maximum pulse amplitude of slightly under 0.6 V and considerable stretching of the pulse. At lower levels of diode current, the negative-going pulse will not send the transistor 12 into saturation and stretching will be more limited (see FIG. 3, where $I_P=1$ μA).

Because the voltage across the capacitor 14 takes time to reach its maximum level in response to a constant-current input ($I_D+I_P$), which is the equivalent behaviour, in terms of current, of an inductor being fed from a constant-voltage input, and because the voltage on the collector goes sharply negative when the input current pulse is removed and decays back to its quiescent value, which is equivalent to the "back-emf" behaviour of an inductor when a driving voltage is removed from it, this circuit has sometimes been called a "gyrator-configured" stage.

Figure 4:
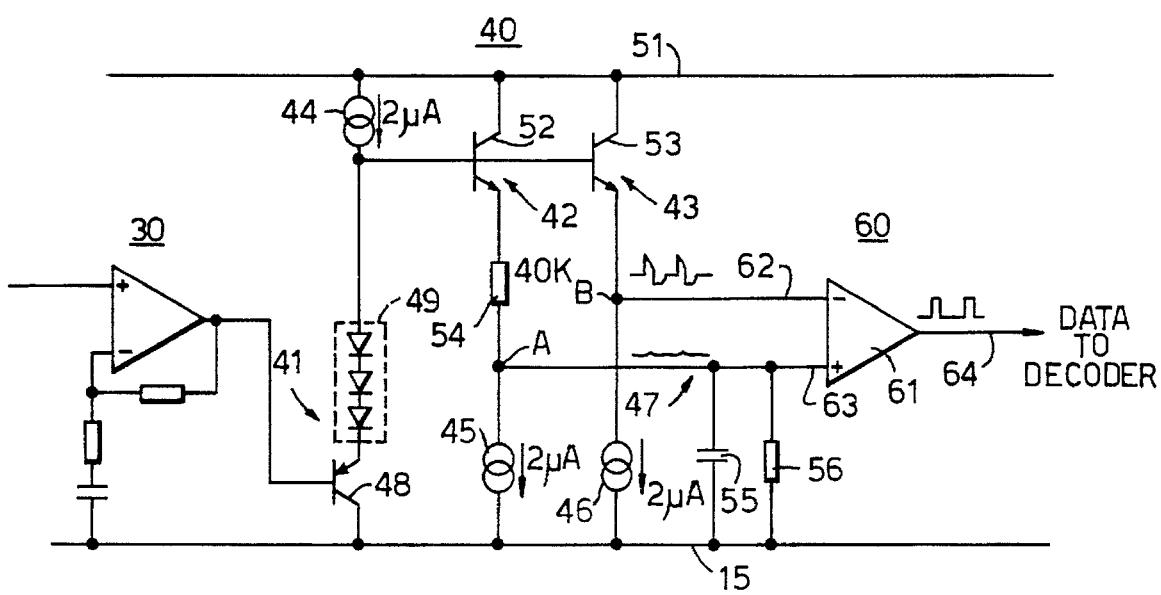
FIG. 4 is a schematic diagram of a pulse detector means in a receiver arrangement according to the invention.

It is this negative-going "back-emf-type" pulse which is now used by the receiver arrangement according to the invention as the basis of further processing in the pulse detection means shown in FIG. 4.

In FIG. 4 an amplifier/buffer 30 receives the output voltage signal from the receiver stage shown in FIG. 1 and amplifies an AC component of that output signal by a set amount, while subjecting a DC component, corresponding mainly to the ambient light level of the diode 19's environment, to unity-gain amplification only. This minimizes the effects of ambient radiation on the pulse detection circuitry, while boosting the desired pulse signal component of the receiver stage output.

The output of the amplifier/buffer 30 is taken to a pulse detector stage 40, consisting of an emitter follower stage 41, two parallel-driven emitter follower stages 42, 43 and associated current sources 44, 45, 46 and a low-pass filter 47. Emitter follower 41 comprises a PNP transistor 48, a voltage shifter 49, consisting of three series-connected diodes, and the current source 44. The base of transistor 48 is fed from the output of the amplifier/buffer 30, while the collector of the transistor 48 is taken to a reference potential 15 and the emitter is taken to a positive supply rail 51 by way of the voltage shifter 49 and the current source 44. The voltage shifter lifts the low quiescent input voltage present on the base of the transistor 48 to a level more suitable for following circuitry.

The junction of the voltage shifter 49 and the current source 44 is taken to the commoned bases of NPN transistors 52 and 53, which, together with current sources 45 and 46, respectively, form the emitter followers 42 and 43. The collectors of transistors 52, 53 are taken to the positive supply rail 51, while the emitters of these transistors are taken to their respective current sources 45, 46, in the case of follower 42 via a resistor 54. Resistor 54 forms one half of the low-pass filter 47, the other half being constituted by the parallel combination of a capacitor 55 and a resistor 56. Resistor 56 and capacitor 55 are connected across the current source 45.

In operation, the quiescent output of the amplifier/buffer 30 is effectively shifted in potential to the potential existing on the emitters of transistors 52 and 53. A potential difference is set up between points "A" and "B" in FIG. 4 due to the current flowing through the resistor 54 and the range-setting resistor 56. Where the receiver arrangement according to the invention is to be used at the maximum end of its range, i.e. where the diode current pulse is small, resistor 56 may be omitted or else made very high impedance, e.g. 3 MΩ.

Under quiescent conditions, there will be a fixed potential difference between points "A" and "B", virtually regardless of the quiescent voltage level at the output of the receiver stage. Although this potential difference will be to some extent dependent on the quiescent voltage level present on the emitter of transistor 42, due to a non-constant current flowing through resistors 54 and 56, this effect is minimized by the relative insensitivity of the receiver stage to ambient light levels, as already mentioned.

The signals on the points "A" and "B" of the pulse detector stage 40 are taken to the inputs of a comparator stage 60 based around a comparator 61. Under no-signal conditions, input 62 of comparator 61 is at a higher voltage than input 63 and consequently the data output 64 of the comparator 61 is held low.

When a diode pulse signal from the receiver stage is received on the input of the amplifier 30, the emitter follower 43 provides on its emitter a faithful reproduction of that signal, i.e. the voltage $V_C$ shown in FIG. 2, whereas the emitter follower 42 provides at the junction of the resistor 54 and the current source 45 the average of that signal. This is due to the action of the filter comprised principally of the resistor 54 and the capacitor 55. The collector voltage $V_C$ responds to the incident, transmitted data pulse by going high for a time duration corresponding to the duration of the received pulse. This same positive-going pulse is reproduced at point "B", but not at point "A" due to the filtering action of the filter 47. Thus, the already existing potential difference between points "A" and "B" is increased and the output 64 of the comparator 61 continues to be held low.

At the end of the initially received current pulse, however, $V_C$ drops suddenly and goes negative (see FIG. 2). Depending on the value chosen for the resistor 56, the negative excursion of $V_C$ will be sufficient to change the output state of the comparator 61 and a data output pulse will be sent out to a following decoder stage (not shown).

It can be seen that the voltage on point "A" under signal conditions is required to be substantially invariant, and this in turn requires the time constant of the filter 47 to be suitably long compared with the decay time of the negative-going pulse (see curve "X" in FIG. 2).

This circuit may be realized in discrete or integrated form. It should be appreciated that, where the circuit is committed to silicon integration, the individual elements of the receiver arrangement shown in FIGS. 1 and 4 will represent only the basic essential elements necessary for the working of a specific embodiment of the invention, and in practice it may be necessary to introduce additional elements not shown in the diagrams or mentioned in the description in the course of the integration process.

I claim:

1. A receiver arrangement for use in a remote control system comprising:
   a) a receiver stage for receiving a current pulse from a transducer and providing a voltage output signal in response thereto, and including means for generating as the voltage output signal a first signal pulse substantially coincident with the current pulse and a second, immediately following, opposite-going pulse at the end of the received current pulse; and
   b) a pulse detector stage including
      i) a pulse discriminator stage for forming a first output signal representative of the average level of the voltage output signal of the receiver stage, and a second output signal representative of the instantaneous level of the voltage output signal of the receiver stage, and ii) a comparator stage for comparing the first and second output signals of the pulse discriminator stage and providing, on the basis of that comparison, a data output signal in response to the second pulse.

2. The receiver arrangement in accordance with claim 1, in which the pulse discriminator stage comprises first and second voltage followers for providing the first and second output signals of the pulse discriminator stage, said first and second voltage followers having respective inputs for receiving a common signal representative of the voltage output signal of the receiver stage, said first voltage follower having an output which provides the first output signal of the pulse discriminator stage through a low pass filter.

3. The receiver arrangement in accordance with claim 2, in which the low-pass filter comprises a resistor and a capacitor connected in series between the output of the first voltage follower and a reference potential.

4. The receiver arrangement in accordance with claim 3, and further comprising a second resistor connected in parallel with the capacitor, the second resistor serving to adjust the sensitivity of the receiver arrangement.

5. The receiver arrangement in accordance with claim 2, and further comprising a voltage shifter interposed between the receiver stage and the first and second voltage followers of the pulse discriminator stage.

6. The receiver arrangement in accordance with claim 5, in which the voltage shifter comprises a third voltage follower feeding the first and second voltage followers.

7. The receiver arrangement in accordance with claim 6, and further comprising at least one diode element interposed between the third voltage follower and the first and second voltage followers.

8. The receiver arrangement in accordance with claim 2, and further comprising a current source in the output circuit of each voltage follower.

9. The receiver arrangement in accordance with claim 2, in which the voltage followers are emitter-followers.

10. A remote control apparatus, comprising;
   a receiver arrangement including:
   a) a receiver stage for receiving a current pulse from an infrared transducer and providing a voltage output signal in response thereto, and including means for generating as the voltage output signal a first signal pulse substantially coincident with the current pulse and a second, immediately following, opposite-going pulse at the end of the received current pulse; and
   b) a pulse detector stage including
      i) a pulse discriminator stage for forming a first output signal representative of the average level of the voltage output signal of the receiver stage, and a second output signal representative of the instantaneous level of the voltage output signal of the receiver stage, and
      ii) a comparator stage for comparing the first and second output signals of the pulse discriminator stage and providing, on the basis of that comparison, a data output signal in response to the second pulse.

* * * * *